United States Patent
Mavroeidis et al.

(10) Patent No.: US 11,000,963 B2
(45) Date of Patent: May 11, 2021

(54) COATED RAZOR BLADES COMPRISING GRAPHENE

(71) Applicant: BIC VIOLEX S.A., Anixi Attiki (GR)

(72) Inventors: Konstantinos Mavroeidis, Stamata (GR); Anastasios Siozios, Marousi Athens (GR); Vasileios Papachristos, Zografou Athens (GR)

(73) Assignee: BIC VIOLEX S.A., Anixi Attiki (GR)

( * ) Notice: Subject to any disclaimer, the term of this patent is extended or adjusted under 35 U.S.C. 154(b) by 0 days.

(21) Appl. No.: 16/500,542

(22) PCT Filed: Apr. 3, 2018

(86) PCT No.: PCT/EP2018/000155
§ 371 (c)(1),
(2) Date: Oct. 3, 2019

(87) PCT Pub. No.: WO2018/184723
PCT Pub. Date: Oct. 11, 2018

(65) Prior Publication Data
US 2020/0189139 A1 Jun. 18, 2020

Related U.S. Application Data

(60) Provisional application No. 62/481,287, filed on Apr. 4, 2017.

(51) Int. Cl.
*B26B 21/60* (2006.01)
*C23C 16/26* (2006.01)
(Continued)

(52) U.S. Cl.
CPC .............. *B26B 21/60* (2013.01); *C23C 16/26* (2013.01); *C23C 16/511* (2013.01);
(Continued)

(58) Field of Classification Search
CPC ....... B26D 21/60; C23C 16/26; C23C 16/511; C23C 16/0245; C23C 28/343; C23C 28/347

See application file for complete search history.

(56) References Cited

U.S. PATENT DOCUMENTS

2010/0287781 A1   11/2010   Skrobis
2015/0367381 A1   12/2015   Sumant et al.
(Continued)

FOREIGN PATENT DOCUMENTS

EP   1259361   4/2005
EP   2429777   3/2012

OTHER PUBLICATIONS

Kim et al, "Chemical vapor deposition-grown graphene: the thinnest solid lubricant", www.acsnano.org acs nano, vol. 5, No. 6 Feb. 10, 2011 (Feb. 10, 2011), pp. 5107-5114.
(Continued)

*Primary Examiner* — Omar Flores Sanchez
(74) *Attorney, Agent, or Firm* — Ohlandt, Greeley, Ruggiero & Perle, L.L.P.

(57) ABSTRACT

A hard coating for a substrate or portion of a razor blade wherein a main layer of the hard coating includes graphene and/or any combination of derivatives thereof. The graphene may be deposited on the substrate or portion of the razor blade using plasma assisted chemical vapor deposition (PECVD) or similar process.

7 Claims, 2 Drawing Sheets

(51) Int. Cl.
  *C23C 16/511* (2006.01)
  *C23C 28/00* (2006.01)
  *C23C 16/02* (2006.01)

(52) U.S. Cl.
  CPC .......... *C23C 28/343* (2013.01); *C23C 28/347* (2013.01); *C23C 16/0245* (2013.01)

(56) References Cited

U.S. PATENT DOCUMENTS

| | | | |
|---|---|---|---|
| 2018/0251641 A1* | 9/2018 | Vasileiou | C09D 7/70 |
| 2019/0085186 A1* | 3/2019 | Vasileiou | C09D 7/70 |
| 2019/0085187 A1* | 3/2019 | Vasileiou | B05D 1/02 |
| 2020/0189138 A1* | 6/2020 | Sonnenberg | C08L 63/00 |
| 2020/0189139 A1* | 6/2020 | Mavroeidis | C23C 16/0272 |

OTHER PUBLICATIONS

International Search Report dated Jun. 7, 2018 in corresponding PCT International Patent Application No. PCT/EP2018/000155, 6 pages.
Written Opinion dated Jun. 7, 2018 in corresponding PCT International Patent Application No. PCT/EP2018/000155, 7 pages.

* cited by examiner

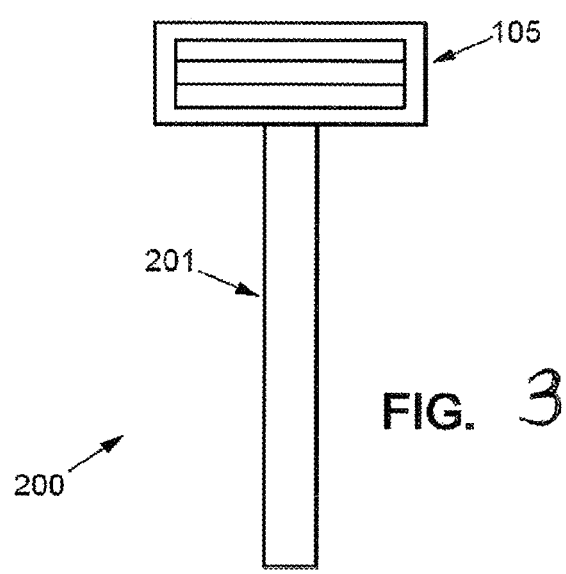
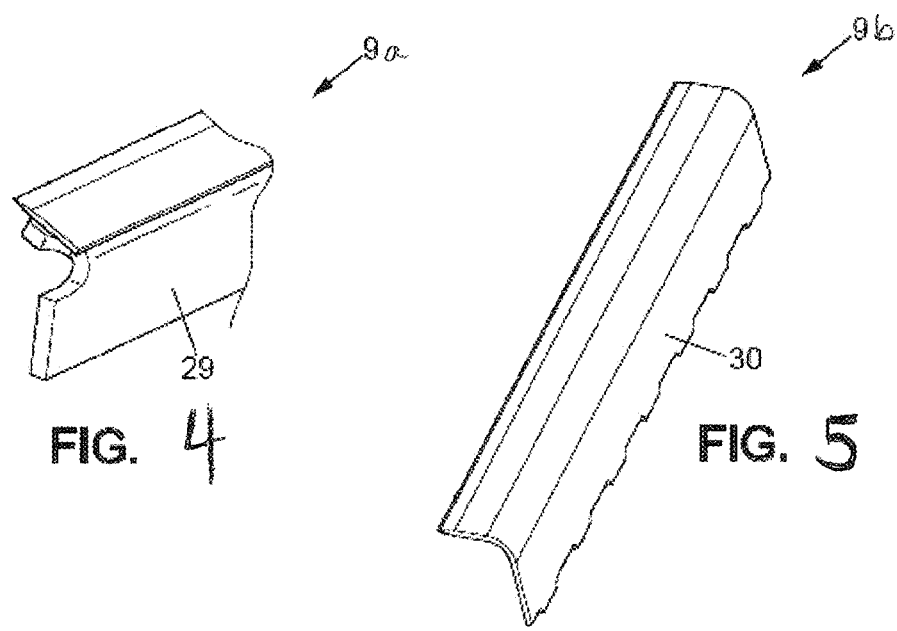

COATED RAZOR BLADES COMPRISING GRAPHENE

CROSS REFERENCE TO RELATED APPLICATIONS

This application is a National Stage Application of International Application No. PCT/EP2018/000155, filed on Apr. 3, 2018, now published as WO2018/184723 and which claims priority to U.S. Provisional Application No. 62/481,287, Apr. 4, 2017, the entire contents of which are incorporated herein by reference.

BACKGROUND

1. Field

The following description relates to coatings applied to the blade of a shaving razor. The coatings generally include graphene, graphene-based materials and/or similar 2-D materials applied to the cutting edge of a blade.

2. Description of Related Art

Conventionally, a blade edge may include a substrate which may be a portion of the blade edge that has been grinded, a hard coating and a lubricating coating. The hard coating is adhered to the substrate and the lubricating coating is adhered to the hard coating. To improve corrosion resistance, edge strengthening, wear resistance and shaving performance, the blade edge that has been grinded is covered with the hard coating. The hard coating may include one or more distinguishable layers, such as an interlayer, a main layer and an overcoat layer. The interlayer facilitates bonding of the main layer with the grinded substrate and the overcoat layer is used to improve adhesion of the lubricating coating with the main layer. The main layer; however, provides corrosion resistance and determines the strength of the blade edge. In general, the properties of the hard coating depend significantly upon the properties of the main layer.

Currently chromium (Cr), chromium-platinum (Cr—Pt) mixtures, chromium-carbon (Cr—C) mixtures, diamond, diamond like carbon (DLC), nitrides, carbides, oxides, borides, and mixtures and/or combinations of layers, with or without the addition of any of the above mentioned metallic elements, are being used as components for the main layer. A disadvantage of these materials is that they are thick and may increase the cutting forces which inhibit the efficiency of shaving performance. Additionally, while these hard coatings are very well known for strength and/or improved edge strength when deposited on a substrate, in particular, they are not known as being stronger than graphene.

SUMMARY

The present disclosure may provide a hard coating, including graphene and/or graphene-based materials and/or similar 2-D materials to the cutting edge of a blade wherein the hard coating overcomes the disadvantages of conventional blade edge hard coatings. More particularly, an aspect of the present disclosure may include the use of graphene and derivatives specifically as a component of the main layer of the hard coating.

Further aspects include a method for coating a substrate including introducing the substrate to a reduced atmosphere chamber; exposing the substrate to RF plasma; subjecting the substrate to a carbon precursor; depositing one or more layers of graphene or graphene-based materials onto the substrate; forming the coating on the substrate. The coating includes one or more distinguishable layers, including an interlayer, a main layer, and an overcoat layer. The distinguishable layers may contain graphene or graphene-based materials or each one of the distinguishable layers may be formed from one or more layers of graphene or graphene-based materials. The coating may also include either an interlayer, a main layer, an overcoat layer, or any combination thereof.

Further aspects include a razor including one or more blades wherein a hard coating is disposed on at least one of the one or more blades. The hard coating includes one or more nano-materials selected from the group consisting of multi-layer materials, nano-composite materials, 2-D materials, van der Waals heterostructures, hybrid compounds, and combinations thereof, and graphene or graphene-based materials.

BRIEF DESCRIPTION OF THE DRAWINGS

FIG. 3 details a shaving device.
FIG. 4 details a razor blade according to an aspect of the disclosure.
FIG. 5 details a razor blade according to a further aspect of the disclosure.

DETAILED DESCRIPTION

Figure 1:
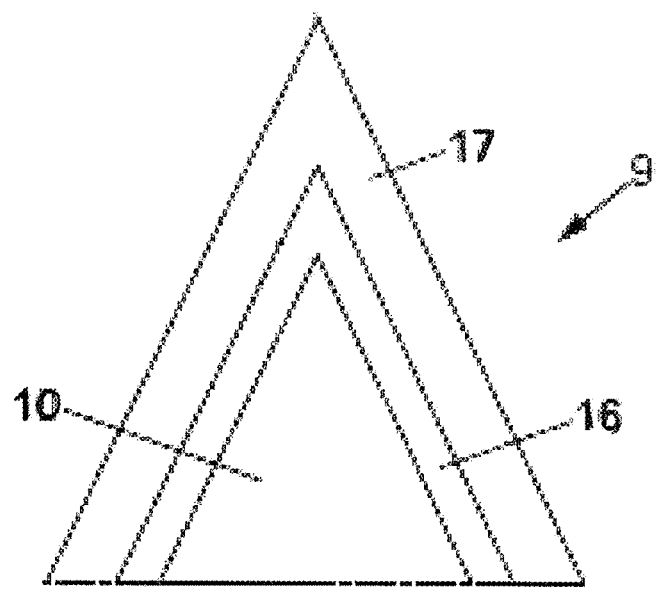
FIG. 1 details a razor blade cutting edge with coatings.
Figure 2:
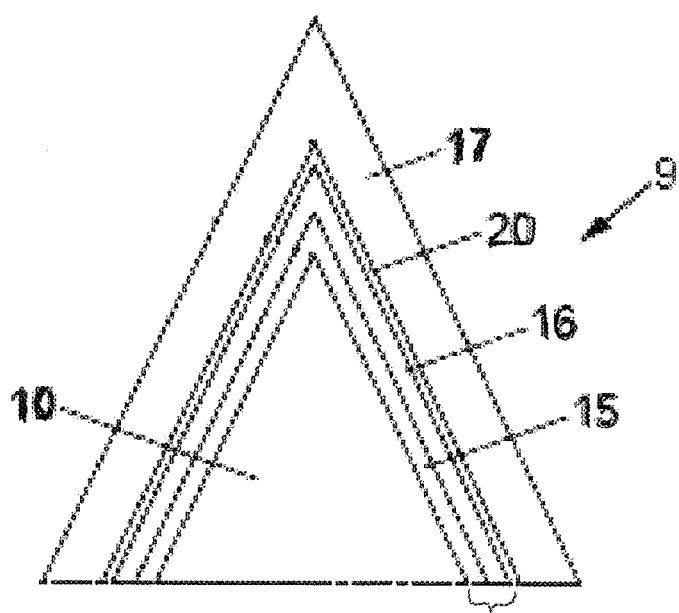
FIG. 2 details the razor blade edge of FIG. 1 showing the distinguishable layers of the hard coating.

Aspects of the disclosure include a hard coating 12 that may include one or more layers, such as an interlayer 15, a main layer 16 and an overcoat layer 20. The main layer 16 may be disposed above the interlayer 15 and below the overcoat layer 20. The interlayer 15 may be used to facilitate the bonding of the main layer 16 with a substrate and/or cutting edge 10 of a razor blade 9. Materials that may be used as the interlayer 15 may be, but are not limited to Cr, Ti, Nb, Mo, Al, Ni, Cu, Zr, W, V, Si, Co, any alloy or any combination thereof. The overcoat layer 20 may be used to improve adhesion of an outer lubricious coating 17, for example, a polymeric film with the main layer 16. Materials that may be used to facilitate bonding of the outer lubricious coating 17 to the main layer 16 may include, but are not limited to Cr, Ti, Nb, Mo, any alloy and/or compound thereof. While graphene may be detailed herein for use as the main layer 16, according to further aspects, titanium diboride may also be used as a part of the main layer 16. In further aspects, graphene and/or graphene-based materials may also be used as the overcoat layer 20 to facilitate bonding of the outer lubricious coating. However, detailed below, the main layer 16 may include graphene and/or any derivative thereof.

To date, graphene has been found to be among the strongest materials ever measured. Stronger than diamond, graphene has a tensile strength of 130 GPa, an in-plane Young's modulus of about 1 TPa and is known as being one hundred times stronger than steel. Graphene and other carbon-related materials such as graphite, carbon nanotubes (CNTs), etc. are known for their anticorrosive properties. Graphene, in particular, consists of a single atomic layer of carbon atoms, arranged in a honeycomb lattice. The lattice is an ultra-dense network which is totally impermeable thereby providing the ability to protect a material or substrate from corrosion. At the same time, graphene is very thin at approximately 0.33 nm which avoids altering the chemical properties of the protected material or substrate to which it is applied. The ability to have an ultra-thin strengthening coating, of possibly a few atoms thick, would contribute to decreased cutting forces thereby improving shaving performance. Therefore, a hard coating 12, which includes graphene as a main component in the main layer 16, that is deposited on the cutting edge 10 of a razor blade 9 would improve the strength, wear and corrosion resistance of the razor blade 9. Additionally, because graphene is thin and includes lubrication characteristics, it may, in some aspects, ultimately be used also as a lubricating coating.

Prior to large production use; however, graphene requires synthesizing. Synthesis of graphene refers to any process for fabricating or extracting graphene. Traditionally, there are six well known techniques for synthesizing graphene such as mechanical cleavage (mechanical exfoliation), chemical exfoliation, chemical synthesis, epitaxial growth, chemical vapor deposition (CVD), total organic synthesis, and other chemical methods.

Chemical vapor deposition (CVD) is most commonly used to deposit/grow high-quality, large areas of graphene sheets (surface area>5 cm$^2$) directly on a surface/substrate. Generally, the process involves placing a substrate in an inert atmosphere processing chamber/oven and heating the substrate to 1000° C. or above. The step of heating the substrate to 1000° C. or more is to ensure that the substrate is cleaned prior to the deposition/growth step. A gas mixture of carbon precursors/sources (e.g. methane, acetylene or solid carbon) and inert gases are introduced into the chamber, initiating the deposition/growth process. Finally, the substrate is rapidly cooled down within minutes in the inert atmosphere and is unloaded from the chamber once the temperature is below 100° C. When the substrate is cooled, the solubility of carbon on the substrate decreases and the carbon precipitates to form large graphene monolayer (single layer) to large multi-layer graphene sheets on the substrate.

According to one aspect, the synthesis and deposition of graphene on a substrate or the cutting edge 10 of a razor blade 9 may include placing the substrate or the cutting edge 10 of the razor blade 9 in a reduced pressure atmosphere environment. However, prior to the introduction of the carbon precursors and the formation of graphene, the substrate or the cutting edge 10 of the razor blade 9 may be cleaned by being subjected to or near room temperature plasma (RF plasma). This method of synthesizing and depositing graphene is called plasma assisted chemical vapor deposition (PECVD). Instead of using an inert atmosphere processing chamber as in CVD, an aspect of the disclosure includes the use of the PECVD method wherein the substrate or the cutting edge 10 of the razor blade 9 may be placed in a reduced pressure atmosphere (a vacuum environment where the pressure is in the range of 25 mTorr to 0.5 Torr, and is more preferably between 25 mTorr and 40 mTorr, and the pressure during processing, is maintained at 500 mTorr).

In some aspects, electrons contained in the RF plasma may need to be excited in order to subject the substrate or cutting edge 10 of the razor blade 9 to the RF plasma confined within the reduced atmosphere chamber. An Evenson cavity, for example, is a microwave plasma source that is capable of sustaining discharges in static and flowing gases at pressures ranging from a few mTorr to several hundred Torr. In one aspect, the Evenson cavity may be used to facilitate excitation of the electrons contained in the RF plasma within the reduced atmosphere chamber. Excitation of the RF plasma electrons facilitates dispersion of the RF plasma thereby allowing the RF plasma to be dispersed about the substrate or cutting edge 10 of the razor blade 9. The Evenson cavity may have an input power of 40 W for a period of 15 minutes with a flow rate of 2 sccm of a gas (e.g. hydrogen). After the substrate or cutting edge 10 of the razor blade 9 has been subjected to the RF plasma, the RF plasma may then be extinguished. The substrate or the cutting edge 10 of a razor blade 9 may then be heated to a growth/deposit temperature of, 200° C., for example, but to no more than 800° C. According to some embodiments the growth/deposit temperature may be, for example, 400° C., within the reduced pressure atmosphere at a flow of 2 sccm of a cleaning gas (e.g. hydrogen) at 42 mTorr. Heating the substrate or cutting edge 10 of the razor blade 9 to temperatures lower than 1000° C., and more specifically to temperatures of at least 400° C. but to no more than 800° C., reduces energy/production cost and moreover, improves the quality of graphene because the stresses endured by the graphene during the rapid cooling down process of the substrate or cutting edges 10 of the razor 9 may be drastically reduced or may be virtually non-existent. While hydrogen may be detailed for use in the reduced atmosphere chamber, in some aspects, other gases such as nitrogen, argon, other noble gases, chlorine, other halogens, mixtures of these gases (e.g., chlorine and argon), and the like may also be utilized. Exposing the substrate or cutting edge 10 of the razor blade 9 to the RF plasma cleans and/or removes native oxides from the substrate or cutting edge 10 of the razor blade 9, therefore increasing reactivity of the substrate or cutting edge 10 of the razor blade 9 for subsequent deposition of graphene when exposed and/or subjected to the carbon precursors.

After exposing the substrate or cutting edge 10 of the razor blade 9 to RF plasma, a carbon precursor may then be added to the substrate or cutting edge 10 of the razor blade 9 within the reduced atmosphere chamber. Regarding one aspect, the carbon precursor may be, for example, $CH_4$, a pre-mixture $H_2$ and $CH_4$, or other suitable carbon sources. The carbon precursor may be added to the reduced atmosphere chamber at a flow rate of 35 sccm which may increase the total pressure within the reduced atmosphere chamber to 500 mTorr or less. The temperature; however, during the flow of the carbon precursor may be room temperature, temperatures below room temperature, or temperatures above room temperature. The flow of the carbon precursor results in the deposition of graphene on the substrate or cutting edge 10 of the razor blade 9.

The substrate or cutting edge 10 of the razor blade 9 may then be subjected to the carbon precursor for a predetermined period of time, for instance approximately fifteen minutes, and the graphene is formed. The substrate or cutting edge 10 of the razor blade 9 may then be cooled under the same flow and pressure conditions (i.e. a flow rate of 35 sccm and pressure of 500 mTorr or less). Graphene may be formed on one or both sides of the substrate or cutting edge 10 of the blade 9, but may be preferably deposited on both sides.

Upon cooling, the substrate or cutting edge 10 of the razor blade 9 may be removed from the reduced atmosphere chamber and inspected. The quality of the presence of graphene may be confirmed through Raman spectra, where the presence of the two characteristics peaks of graphene G and 2D at 1580 and 2700 cm$^{-1}$, respectively, and the absence of a pronounced defective peak at 1350 cm$^{-1}$, indicates that the graphene sheets are of good quality.

In some aspects, large area and high quality graphene sheets (e.g., a graphene film) may be produced in a single step using the PECVD method at reduced temperatures. In this aspect, the substrate or cutting edge 10 of the razor blade 9 may be subjected to a hydrogen plasma containing trace amounts of a carbon precursor, such as methane.

According to further aspects, various alternate methods of growing/depositing graphene on a substrate or cutting edge 10 of a razor blade 9 may include, for example, Atomic Layer Chemical Vapor Deposition (ALCVD or Atomic Layer CVD), Atmospheric Plasma Chemical Vapor Deposition (APCVD or Atmospheric Plasma CVD), Vapor-Liquid-Solid (VLS) method, sputtering, or physical vapor deposition process. For the CVD processes, methane, acetylene or solid carbon may be used as the carbon source or carbon precursor.

Yet further aspects may include the step of contacting the substrate or cutting edge 10 of the razor blade 9 with a vapor of a C1-C18 hydrocarbon-containing compound at a temperature from at least 300° C. to at least about 500° C. to form anywhere from 1 to 10 single layers of graphene. Advantageously, in accordance with this aspect of the method graphene may be formed by chemical vapor deposition (CVD) or atomic layer deposition.

According to further aspects, graphene monolayers (single layers) may be formed by one or a plurality of atomic layer deposition (ALD) cycles. Each ALD deposition cycle may produce a single layer of graphene wherein a stack of graphene layer is constructed layer by layer. An ALD deposition cycle may include a step where the substrate or the cutting edge 10 of the razor blade 9 may be contacted with the vapor of the C1-C18 hydrocarbon-containing compound in an ALD reaction chamber. After the substrate or cutting edge 10 of the razor blade 9 is exposed to the vapor of the C1-C18 hydrocarbon-containing compound, the ALD reaction chamber may optionally be purged with an inert gas (e.g., argon, helium, nitrogen, etc.).

In further aspects, the growth/deposition of graphene may include other graphene-based materials or other materials which may also be grown/deposited on the substrate or cutting edge 10 of the razor blades 9, for example:

1. graphene based materials may include, but not limited to, multilayer graphene nanoplatelets or large area sheets (as a stack of few atomic planar layers interacting by Van der Waals forces with average thickness up to 10 nm), graphite nanoplatelets, carbon nanotubes (single or multi-walled CNTs), diamond-like carbon (DLC), graphite, amorphous carbon, Bucky Balls.
2. nanoplatelets or large area sheets of thin or thick 2-D materials with average thickness up to 10 nm or greater than 10 nm, respectively, including, but not limited to, graphene, boron nitride (BN), tungsten (IV) sulfide (WS2), molybdenum disulfide (MoS2)).
3. hybrid compounds including materials made by mixing suitable combinations of single or multi-graphene large sheets or nanoplatelets, carbon nanotubes (single or multi-walled CNTs), diamond-like carbon (DLC), graphite, amorphous carbon, and Bucky Balls CNTs with other 2-D materials.
4. Van der Waals heterostructures which include layer-by-layer stacks of graphene or multi-layer graphene with different 2-D materials.
5. graphene oxides may include graphene oxide nano-platelets, both single layer and multi-layer planar sheets interacting by van der Waals forces with an average thickness of up to about 10 nm and a lateral size of up to about 100 μm.
6. graphite oxides may include graphite oxide nano-platelets, the nano-platelets may include crystals with a thickness of greater than about 10 nm deposition process; providing a surface area of greater than about 5 cm$^2$.

In further aspects, the hard coating 12 may include several composite configurations.

For example, the hard coating 12 may include of any one of the following:

1. only one layer of graphene or any graphene-based materials or any 2-D material.
2. a multi-layer structure of alternating layers of graphene or graphene-based materials or 2-D materials, or hybrid compounds or Van der Waals heterostructures and a metal or ceramic or oxide or nitride and borides, respectively. The metal may be Ti, Cr, Pt, Co, W, V, Nb, Mo, Ni, Al, Si, Hf, B, Zr, Cu and/or any alloy of them.
   a nanocomposite material where graphene or graphene-based materials or 2-D materials, or hybrid compounds or Van der Waals heterostructures may be used either as a matrix or as an embedded phase. In a first approach, the embedded phase may be metal such Cr, Pt, Al, Ti, with any combination oxides, ceramics, and/or carbides. In a second approach, the graphene or graphene-based materials or 2-D materials, or hybrid compounds or Vander Waals heterostructures may be embedded with a metallic, ceramic, carbide, boride or nitride matrix.

In further aspects, the hard coating 12 may include composite materials that may be made by bringing graphene and other 2-D thin or thick materials, such as hexagonal BN (hBN) layers together, or by forming one layer upon another layer. For example, when using a graphene/hBN composite material, the substrate or cutting edge 10 of the razor blade 9 having a graphene layer disposed thereon, may include a boron nitride source material deposited on the graphene layer to facilitate forming the hBN layer on the graphene. Thus, the graphene layer may be utilized during the deposition as a template for the hBN layer. The hBN layer may be deposited by any known method, including the CVD and PVD processes.

Embodiments include a graphene layer deposited using a 2-D material, such as hBN layer as a template. The graphene layer may include a plurality of graphene monolayers and the hBN layer may include a plurality of hBN monolayers and the plurality of graphene layers and the plurality of hBN layers may be alternated one upon the other.

Yet, when graphene is produced using alternative methods such as mechanical cleavage (mechanical exfoliation), epitaxial growth or chemical method, the hard coating may include:

1. graphene nanoplatelets, multi-layer graphene nano-platelets and graphite nanoplatelets which may be isolated by peeling them off from graphite using a Scotch tape.
2. graphene nanoplatelets and multi-layer graphene nano-platelets, which are synthesized via epitaxial growth or via total organic synthesis, may be applied to at least a part of the substrate or surface of the blade edge.
   The graphene nanoplatelets and multi-layer graphene nanoplatelets may be present substantially over the entire surface of the substrate and have a thickness from 10 to 500 nm. Graphene nanoplatelets may be defined here as a single atomic layer and multi-layer graphene nanoplatelets may be defined here as a stack of few atomic layers (single layer) interacting by Van der Waals forces with average thickness up to 10 nm and lateral size up to 100 µm.
3. graphene and graphite oxide nanoplatelets, which may be produced after the chemical oxidation of multi-layer graphene or graphite, respectively.

According to further aspects, carbyne has been found to have a strength at least similar to and perhaps maybe superior to that of graphene. Carbyne may have a tensile strength double that of graphene; and may also demonstrate twice the tensile stiffness of graphene and carbon nanotubes, and nearly three times the tensile stiffness of diamond. As such, the main layer 16 of the hard coating 12 may include carbyne as the main component, in place of graphene. Carbyne is an indefinitely long one-dimensional chain of carbon atoms linked one to the other. The chain of carbon atoms may be linked either by alternate triple and single bonds or by consecutive double bonds. Carbyne may further include two sheets of graphene, laid on top of each other, and rolled to create a double-walled tube. The carbyne inside the tube may then be synthesized, thereby providing a protective casing for stability and allowing the material to remain in-tact for use. Synthesized carbyne may also be perceivably deposited on a substrate or cutting edge 10 of a razor blade 9 by methods similar to those using graphene, such as for example, plasma assisted chemical vapor deposition (PECVD), Atomic Layer Chemical Vapor Deposition (AL-CVD or Atomic Layer CVD), Atmospheric Plasma Chemical Vapor Deposition (APCVD or Atmospheric Plasma CVD), Vapor-Liquid-Solid (VLS) method, sputtering, or physical vapor deposition processes.

In other aspects, the hard coating 12 may be adhered to the cutting 10 of a razor blade 9. The razor blade 9 may be formed from a continuous substrate of raw material such as stainless steel wherein the continuous substrate has been previously subjected to a metallurgical treatment. For instance, the continuous substrate may be mainly iron, which by weight is C: 0.40-0.80%; Si: 0.10-1.5%; Mn: 0.1-1.5%; Cr: 11.0-15.0%; and Mo: 0.0-5.0%. While this formulation of stainless steel is detailed, other stainless steel materials may also be used as the continuous substrate. Additionally, materials such as ceramic and glass may also be considered. The cutting edge 10 of the razor blade 9 may have a desired blade profile, which may be formed after a portion of the continuous substrate has undergone a grinding process to form the desired profile.

In further aspects, after the blade profile has been formed, the cutting edge 10 of the razor blade 9 which has been grinded may be introduced into a deposition chamber in order to be coated with the hard coating 12. The hard coating 12 may include one or more distinguishable layers, such as an interlayer 15, a main layer 16 and an overcoat layer 20. The interlayer 15 facilitates bonding of the main layer 16 with the grinded substrate/cutting edge 10 of the razor blade 9 and the overcoat layer 20 is used to improve adhesion of the outer lubricious coating 17 with the main layer 16. In general, the hard coating 12 may include:
1. only one layer of graphene or any graphene based materials, including but not limited to multi-layer graphene nanoplatelets or large area sheets, carbon nanotubes (single or multi-walled CNTs), diamond-like carbon (DLC), graphite, amorphous carbon, Bucky Balls, or other thin or thick 2-D materials including, but not limited to, nanoplatelets or large area sheets of boron nitride (BN), tungsten (IV) sulfide ($WS_2$), molybdenum disulfide ($MoS_2$).
2. hybrid compounds including materials made by mixing suitable combinations of single or multi-graphene large sheets or nanoplatelets, carbon nanotubes (single or multi-walled CNTs), diamond-like carbon (DLC), graphite, amorphous carbon, and Bucky Balls CNTs with other 2-D materials.
3. Van der Waals heterostructures which include layer-by-layer stacks of graphene or multi-layer graphene with different 2-D materials.
4. a multi-layer structure of alternating layers of graphene or graphene based materials or 2-D materials, or hybrid compounds or Van der Waals heterostructures and a metal or ceramic or oxide or nitride and borides, respectively. The metal may be Ti, Cr, Pt, Co, W, V, Nb, Mo, Ni, Al, Si, Hf, B, Zr, Cu and/or any alloy of them.
5. a nanocomposite material where graphene or graphene based materials or 2-D materials, or hybrid compounds or Van der Waals heterostructures may be used either as a matrix or as an embedded phase. In a first approach, the embedded phase may be metal such Cr, Pt, Al, Ti, with any combination oxides, ceramics, and/or carbides. In a second approach, the graphene or graphene based materials or 2-D materials, or hybrid compounds or Van der Waals heterostructures may be embedded with a metallic, ceramic, carbide, boride or nitride matrix.

In further aspects, after the hard coating 12 has been deposited on the cutting edge 10 of the razor blade 9 through the deposition process, the cutting edge 10 of the razor blade 9 may then be covered with the outer lubricious coating 17. The outer lubricious coating 17 may be hydrophobic or hydrophilic, such as polyfluorocarbon, for example polytetrafluoroethylene (PTFE). The outer lubricious coating 17 provides a reduction of the friction between a shaving device 200 shaving cartridge 105 and the skin.

In further aspects, once the hard coating 12 and the outer lubricious coating 17 has been deposited on the cutting edge 10 of the razor blade 9, the razor blade may then be assembled with the shaving device 200. The shaving device may include a shaving handle 201 and the shaving cartridge 105. The shaving cartridge 105 may be fixedly or removably secured to the shaving handle 201. Two or more razor blades 9 may be movably or fixedly assembled onto the shaving cartridge 105. In some aspects, the shaving cartridge 105 may be part of a shaving device 200 or may be separate from the shaving device 200. In some aspects, the razor blades 9 may be movably mounted to the shaving cartridge 105 by elastic fingers. The elastic fingers elastically bias the razor blades 9 toward a rest position. In further aspects, the razor blades 9a may be fixedly welded to a support 29. The support 29 may be made from a metal material and formed into an L-shaped in cross-section. Alternatively, the razor blades 9 may be integrally bent blades 9b, wherein the hard coating 12 may be applied between the cutting edge 10 and a bent portion 30.

While the aspects of the disclosure have been described in detail in the foregoing description, the same is to be considered as illustrative and not restrictive in character, it being understood that only some aspects have been shown and described and that all changes and modifications that come within the spirit of the disclosure are desired to be protected. Although particular aspects of the disclosure have been described, it would be obvious to those skilled in the art that various other changes and modifications can be made without departing from the spirit and scope of the disclosure. It is therefore intended to cover in the appended claims all such changes and modifications are within the scope of the disclosure.

What is claimed is:

1. A method for coating a razor blade comprising:
introducing the blade to a reduced atmosphere chamber;
exposing the blade to RF plasma;
subjecting the blade to a carbon precursor;
depositing one or more graphene or graphene-based materials onto the blade;
forming a coating on the blade wherein the coating includes one or more discrete layers, including an interlayer, a main layer, and an overcoat layer; and
wherein in the main layer includes a graphene, graphene-based material, or any material that is a derivative of graphene.

2. The method of claim 1, wherein after the step of exposing the blade to RF plasma, the method further comprising:
heating the blade to a temperature of at least 200° C. but to no more than 800° C.

3. The method of claim 2, wherein the graphene or graphene-based materials are selected from the group consisting of multi-layer graphene materials, nanocomposite materials, 2-D materials, van der Waals heterostructures, hybrid compounds, graphene oxides, and combinations thereof.

4. The method of claim 3, wherein the multi-layer graphene materials are selected from the group consisting of graphite nanoplatelets, carbon nanotubes (CNTs), diamond-like carbon (DLC), graphite, graphite oxides, amorphous carbon, Bucky Balls, and combinations thereof.

5. The method of claim 3, wherein the 2-D materials are selected from the group consisting of graphene, boron nitride (BN), tungsten (IV) sulfide (WS2), and molybdenum disulfide (MoS2).

6. The method of claim 4, wherein the multi-layer graphene materials include materials selected from the group consisting of a metal, ceramic, oxide, nitride and boride.

7. The method of claim 6, wherein the metal is selected from the group consisting of Ti, Cr, Pt, Co, W, V, Nb, Mo, Ni, Al, Si, Hf, B, Zr, Cu and combinations thereof.

* * * * *